(12) United States Patent
Veenstra et al.

(10) Patent No.: US 6,605,960 B2
(45) Date of Patent: Aug. 12, 2003

(54) PROGRAMMABLE LOGIC CONFIGURATION DEVICE WITH CONFIGURATION MEMORY ACCESSIBLE TO A SECOND DEVICE

(75) Inventors: Kerry S. Veenstra, San Jose, CA (US); Boon-Jin Ang, Penang (MY)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/038,470

(22) Filed: Jan. 3, 2002

(65) Prior Publication Data

US 2003/0122577 A1 Jul. 3, 2003

(51) Int. Cl.[7] .............................. G06F 7/38; G06F 13/36; H03K 19/173
(52) U.S. Cl. .............................. 326/38; 326/40; 326/46; 710/309
(58) Field of Search ..................... 326/38, 39, 40, 326/41, 46, 47; 710/309

(56) References Cited

U.S. PATENT DOCUMENTS

| | | | |
|---|---|---|---|
| 5,463,740 A | * 10/1995 | Taniai et al. | 395/299 |
| 5,493,239 A | * 2/1996 | Zlotnick | 326/38 |
| 5,559,751 A | 9/1996 | Trinberger | |
| 5,760,607 A | 6/1998 | Leeds et al. | |
| 5,789,938 A | 8/1998 | Erickson et al. | |
| 5,923,614 A | 7/1999 | Erickson et al. | |
| 6,020,633 A | 2/2000 | Erickson | |
| 6,031,391 A | 2/2000 | Couts-Martin et al. | |
| 6,097,211 A | 8/2000 | Couts-Martin et al. | |
| 6,192,436 B1 | 2/2001 | Jacobson et al. | |
| 6,259,271 B1 | 7/2001 | Couts-Martin et al. | |
| 6,269,020 B1 | 7/2001 | Turner | |
| 6,446,147 B1 | * 9/2002 | Dajer et al. | 710/100 |

* cited by examiner

Primary Examiner—Daniel Chang
(74) Attorney, Agent, or Firm—Morrison & Foerster LLP

(57) ABSTRACT

A programmable logic configuration device is disclosed having a configuration memory accessible by a controller of the configuration device and by a second device. Arbitration circuitry is provided for arbitrating access to the configuration memory between the configuration controller and the second device.

30 Claims, 9 Drawing Sheets

PROGRAMMABLE LOGIC CONFIGURATION DEVICE WITH CONFIGURATION MEMORY ACCESSIBLE TO A SECOND DEVICE

TECHNICAL FIELD

The present invention relates to configuration devices used to program devices such as a programmable logic devices or other similar devices.

BACKGROUND OF THE INVENTION

Programmable logic devices ("PLDs") (also sometimes referred to as PALs, PLAs, FPLAs, EPLDs, EEPLDs, LCAs, or FPGAs), are well-known integrated circuits that provide the advantages of fixed integrated circuits with the flexibility of custom integrated circuits. Such devices are well known in the art and typically provide an "off the shelf" device having at least a portion that can be electrically programmed to meet a user's specific needs. Application specific integrated circuits ("ASICs") have traditionally been fixed integrated circuits, however, it is possible to provide an ASIC that has a portion or portions that are programmable; thus, it is possible for an integrated circuit device to have qualities of both an ASIC and a PLD. The term PLD as used herein will be considered broad enough to not necessarily exclude such devices.

In some implementations, a PLD is programmed by the system processor, the system processor being any circuitry primarily responsible for interacting with memory and I/O devices to execute instructions for carrying out system tasks.

Such implementations are acceptable when the processor is not relying on the PLD for its logic operations. However, when the processor would be relying on the PLD for some of its logic (or the PLD itself is the system processor), then it is generally preferable to have a configuration device for configuring the PLD that is in addition to the system processor.

A configuration device for programming a PLD may include a controller and a memory, the controller being any circuitry using information stored in a memory to configure a PLD. Controllers may be implemented as a simplified processor or a controller might be implemented as a processor that is used primarily to perform only a limited range of tasks such as programming a PLD. The controller itself may be implemented as a PLD used to configure another PLD. Current memories such used in PLD configuration devices are generally 16 megabit memory chips. However, configuration device controllers typically only utilize 4–9 megabits of memory. Some pins to the memory may be needed during testing but are excess during actual system implementation. Thus, when implemented, a 16 megabit configuration memory may have, for example, 7 megabits of unused memory locations. Thus, there is a need to address the problem of under-utilization of the configuration device's memory resources.

SUMMARY OF THE INVENTION

The present invention provides an apparatus, system, and method in which a memory of a PLD configuration device is made accessible to other devices.

An embodiment of the present invention implements a PLD configuration device with a pin accessible bus through which a memory of the configuration device is accessed both by a controller of the configuration device and by a processor of the electronic system in which the PLD configuration device is implemented. Arbitration circuitry implements an arbitration scheme that arbitrates access to the configuration device memory between the configuration controller and the processor. In an alternative embodiment, a memory of the PLD configuration device accessed by a controller of the configuration device is accessible to a PLD configured by the PLD configuration device during normal operation of the PLD once it is configured. In another alternative embodiment, a PLD configuration device is part of the PLD itself.

An exemplary arbitration scheme used to implement particular embodiments of the present invention allows a configuration device controller accessing the configuration device memory to complete memory access for configuration purposes without interruption by a processor (which may be a PLD), or by a PLD (which may or may not be acting as a processor) that may, at other times, access the same memory.

By allowing devices in addition to a controller of a configuration device to access configuration device's memory, the present invention addresses the problem of under-utilization of the configuration device's memory resources.

BRIEF DESCRIPTION OF THE DRAWINGS

The novel features of the invention are set forth in the appended claims. However, for purpose of explanation, several aspects of particular embodiments of the invention are described by reference to the following figures.

DETAILED DESCRIPTION OF PARTICULAR EMBODIMENTS OF THE INVENTION

The following description is presented to enable any person skilled in the art to make and use the invention, and is provided in the context of particular applications and their requirements. Various modifications to the disclosed embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Figure 1:
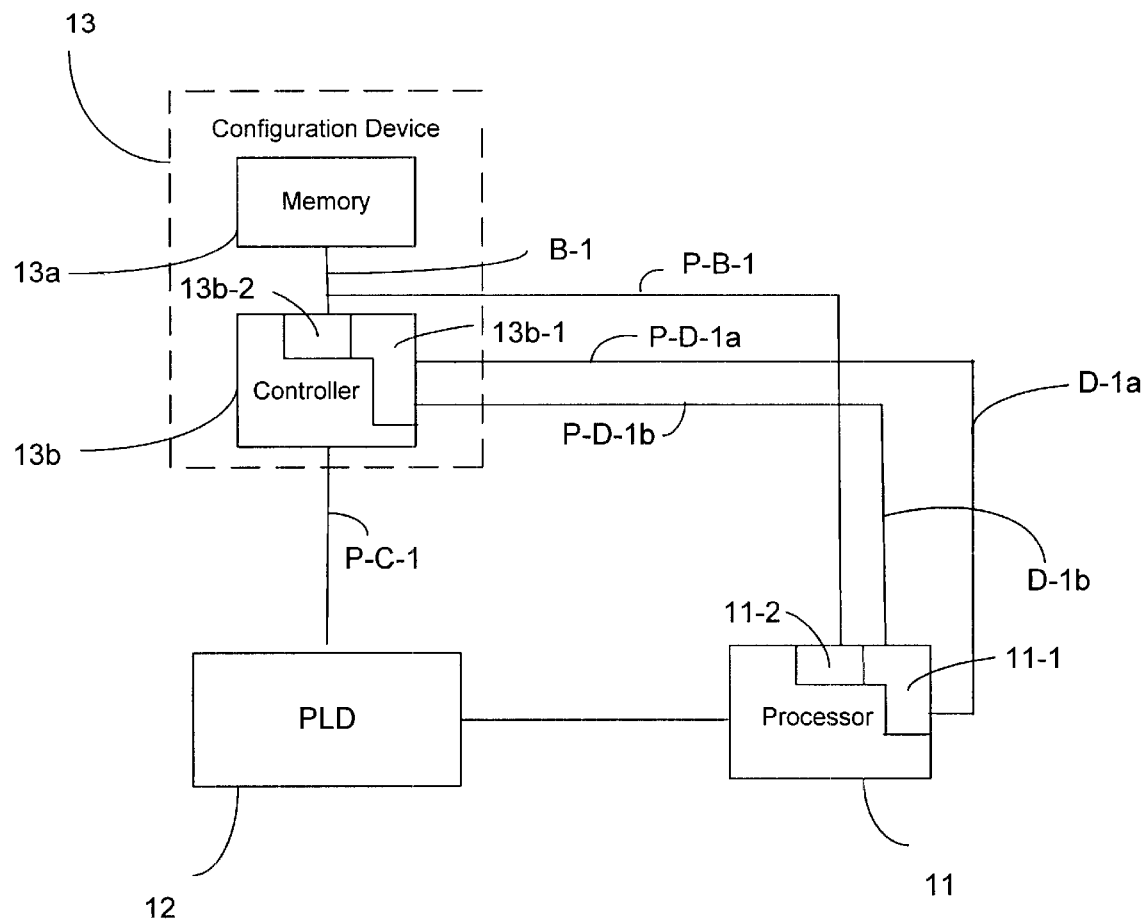
FIG. 1 illustrates an embodiment of an implementation of the present invention in which a system processor accesses a memory of a PLD configuration device also accessed by a controller of the PLD configuration device.

FIG. 1 shows an electronic system (i.e. any system involving electrical or electromagnetic signals) 10 in which an embodiment of the present invention may be implemented. System 10 includes a processor 11, a programmable logic device (PLD) 12, and a PLD configuration device 13. PLD configuration device 13 includes a memory 13a and a controller 13b. In the present embodiment, configuration device 13 is implemented as a single package. Memory 13a may be implemented, for example, as a non-volatile memory chip such as a 16 megabit flash memory chip. Controller 13b may be implemented as a controller chip operatively coupled to the 16 megabit flash memory chip serving as memory 13a. As one possible alternative, memory 13a and controller 13b might be implemented on a single chip with a first portion of the chip serving as memory 13a and a second portion of the chip serving as controller 13b.

PLD configuration controller 13b is connectable to PLD 12 via pins P-C-1. PLD configuration controller 13b is operatively coupled to memory 13a via bus line B-1. Bus line B-1 is also accessible for connection with processor 11 via pins P-B-1 so that processor 11 may also access memory 13a. Pins P-B-1 comprise one or more pins for connecting a conductive path or paths between bus B-1 and processor 11-1. The term "pins" as used herein includes conductive paths from one device for connection to another device. "Pins" as used herein may refer to one or more male connector heads for insertion into a female connector, or for soldering to a circuit board, to complete a conductive path or paths between devices. However, the term pins as used herein has a broader definition and may therefore also simply refer to a conductive path (or paths) itself, whether or not the conductive path is capable of being readily disconnected and reconnected through, for example, male and female complementary connectors. Thus, where a conductive path exists between two devices and whether or not that path is readily disconnectable and re-connectable, the first device may be said to be operatively coupled to "pins" connectable to the second device. Controller 13b is also operatively coupled to pins P-D-1a and pins P-D-1b for connection to processor 13 over dedicated lines D-1a and D-1b.

Controller 13b and processor 11 are operatively coupled to arbitration circuitry comprising arbitration circuitry 13b-1 and memory access circuitry 13b-2 internal to controller 13b, and arbitration circuitry 11-1 and memory access circuitry 11-1 internal to internal to processor 11. The arbitration circuitry implements an arbitration scheme to arbitrate access to memory 13a between controller 13b and processor 11 so that each in turn (or neither) may access memory 13a. The arbitration circuitry may be special purpose fixed circuitry or may be general purpose circuitry that is programmed to perform the arbitration functions described herein.

Typically, commercially available processors that might be used as processor 11 have existing internal arbitration circuitry such as arbitration circuitry 11-1 to manage the processor's access to other elements such as a memory.

Arbitration circuitry 13b-1 interacts with arbitration circuitry 11-1 in a manner that implements the arbitration scheme illustrated and described in FIGS. 5–9 and accompanying text. The arbitration scheme defines rules for signaling and access of memory 13a by controller 13b and processor 11. Memory access circuitry 11-2 is responsive to arbitration circuitry 11-1 and memory access circuitry 13b-2 is responsive to arbitration circuitry 13b-1. Memory access circuitry 11-2 and 13b-2 may comprise, for example, buffers that may either open a connection to memory or may be tri-stated in response to, respectively, arbitration circuitry 11-1 and arbitration circuitry 13b-1.

Those skilled in the art will recognize that the distribution of arbitration circuitry including memory access circuitry illustrated in FIG. 1 represents just one example of how such circuitry might be distributed. As another example, arbitration circuitry 11-1 might be located in PLD 12 and accessed by processor 11 for arbitration purposes. To cite another example, memory access circuitry responsive to the arbitration circuitry might be located in bus line B-1. As another example, if arbitration circuitry 11-1 and 13b-1 are not compatible for operating in concert to implement the desired arbitration scheme (i.e. they define different rules for signaling and memory access) and if reprogramming one or the other or both of arbitration circuitry 11-1 and 13b-1 to establish such compatibility is not practical, then it might be necessary to include arbitration translation circuitry that might be located in controller 13b, along dedicated lines D-1a and D-1b, in processor 11, or in PLD 12. Such translation circuitry would allow arbitration circuitry 11-1 and 13b-1 to work together to implement a desired arbitration scheme. As yet another example, a single device might be interposed between controller 13b, memory 13a, and processor 11 in order implement arbitration and memory access functions to effectively arbitrate access to memory 13a. Those skilled in the art will recognize that these and other variations are possible without departing from the spirit of the present invention.

Figure 2:
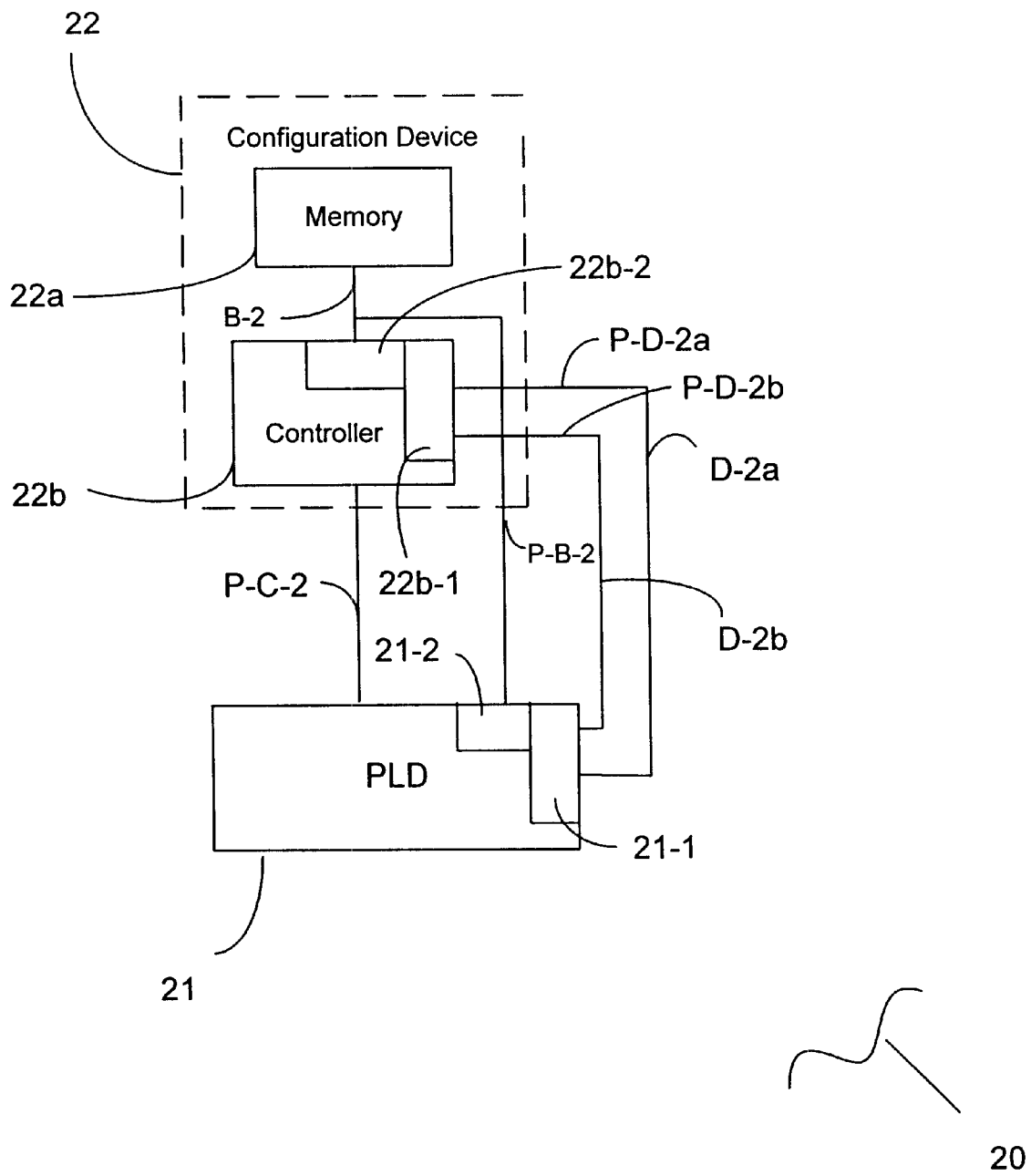
FIG. 2 illustrates another embodiment of the present invention in which a PLD accesses a memory of a PLD configuration device also accessed by a controller of the PLD configuration device.

FIG. 2 is an illustrative drawing of a system 20 in which an alternative embodiment of the present invention may be implemented. System 20 includes PLD 21 and PLD configuration device 22. PLD configuration device 22 includes memory 22a and controller 22b. Controller 22b is connectable to PLD 21 via pins P-C-2. Controller 22b is operably coupled to memory 22a via bus line B-2. Bus line B-2 is accessible for connection with PLD 21 via pins P-B-2.

Controller 22b includes arbitration circuitry comprising arbitration circuitry 22b-1 and memory access circuitry 22b-2 responsive to arbitration circuitry 22b-1. Arbitration circuitry 22b-2 is connectable to PLD 21 via pins P-D-2a and pins P-D-2b (each of which may include one or more pin) for connection over dedicated lines D-2a and D-2b. PLD 21 includes arbitration circuitry comprising arbitration circuitry 21-1 and memory access circuitry 21-2 responsive to arbitration circuitry 21-1.

In the system implementation illustrated in FIG. 2, controller 22b and PLD 21 both access memory 22a via bus B-2. Generally, when the present invention is implemented in the manner illustrated in FIG. 2, a PLD such as PLD 21 is also acting as the system processor. However, it is possible that an embodiment of the present invention might be implemented in a system where a PLD such as PLD 21 shares access to a memory such as memory 22a with a controller such as controller 22b and the PLD is not also acting as the primary system processor. In such other systems, the system may have an additional processor (additional processor not shown), the additional processor having access to another memory (other memory not shown).

Figure 3:
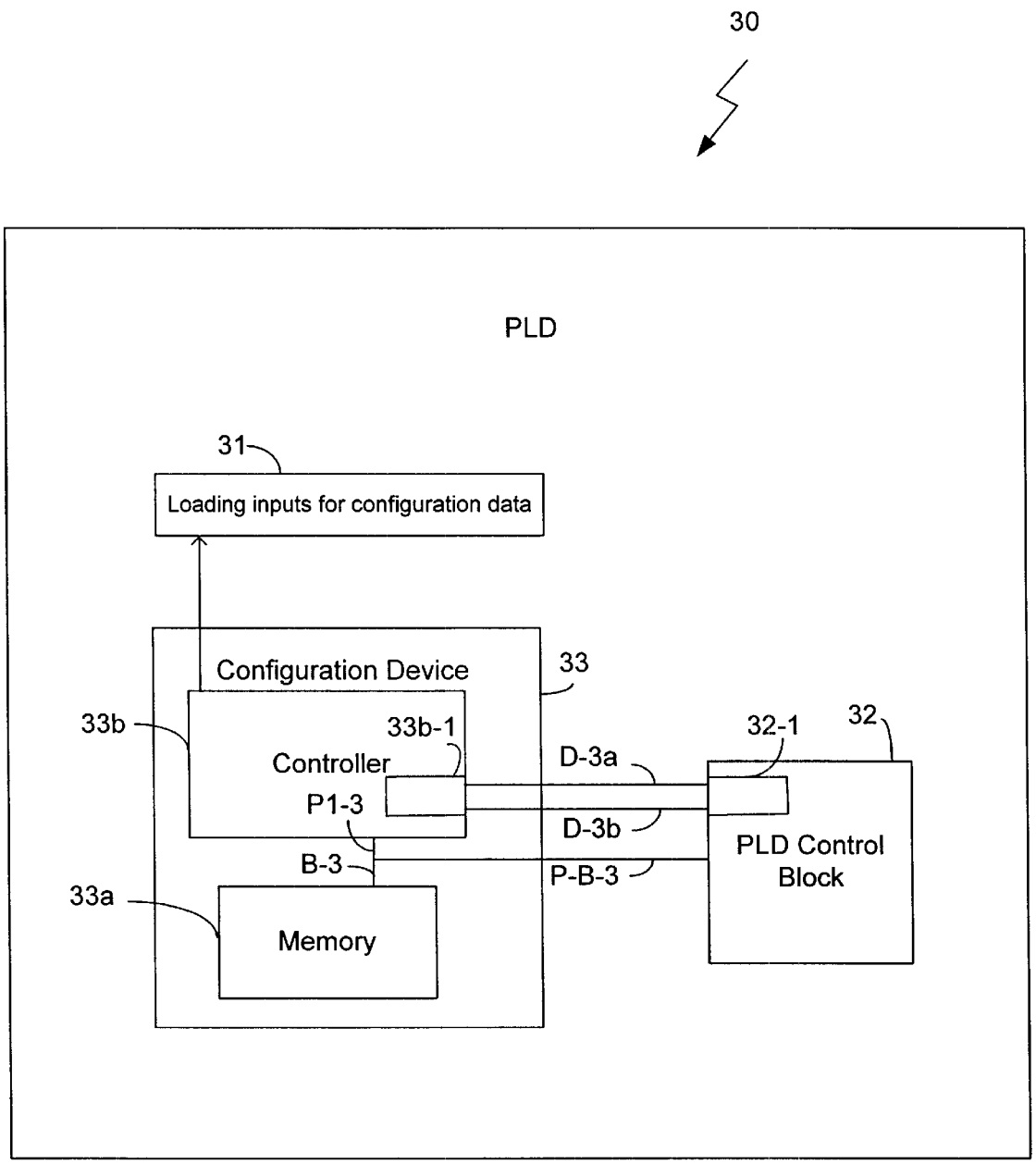
FIG. 3 illustrates another embodiment of the present invention in which a PLD configuration device is part of the PLD that it configures and a memory of the configuration device is accessible to other blocks within the PLD.

FIG. 3 is an illustrative drawing of a PLD 30 in which an alternative embodiment of the present invention may be implemented. PLD 30 includes configuration data loading block 31, control block 32 and configuration device 33. Configuration data loading block 31 is circuitry in PLD 30 for handling the loading of configuration data into appropriate configuration elements of PLD 30 (configuration elements not separately shown). Control block 32 is circuitry for coordinating and directing various functions of PLD 30. PLD configuration device 33 includes memory 33a and controller 33b. Controller 33b is connected for loading configuration data into the PLD through configuration data loading block 31. Controller 33b is operably coupled to memory 33a via connection line P1-3 and bus line B-3. Bus line B-3 is operably coupled with PLD control block 32 via connection line P-B-3. Controller 33b includes arbitration circuitry comprising arbitration circuitry 33b-1 (including memory access circuitry not separately shown). PLD control block 32 includes arbitration circuitry 32-1 (including memory access circuitry not separately shown). In the implementation illustrated in FIG. 3, controller 33b and PLD control block 32 both access memory 33a via bus B-3.

It will be appreciated by those skilled in the art that, in alternative embodiments, functional blocks (i.e. circuitry for performing a particular function or functions, which circuitry may be composed of contiguous or non-contiguous circuit elements) within a PLD such as PLD 30 other than control block 32 might be connected to a bus such as bus B-3 for obtaining arbitrated access to a memory such as memory 33a of a configuration device such as configuration device 33.

Figure 4:
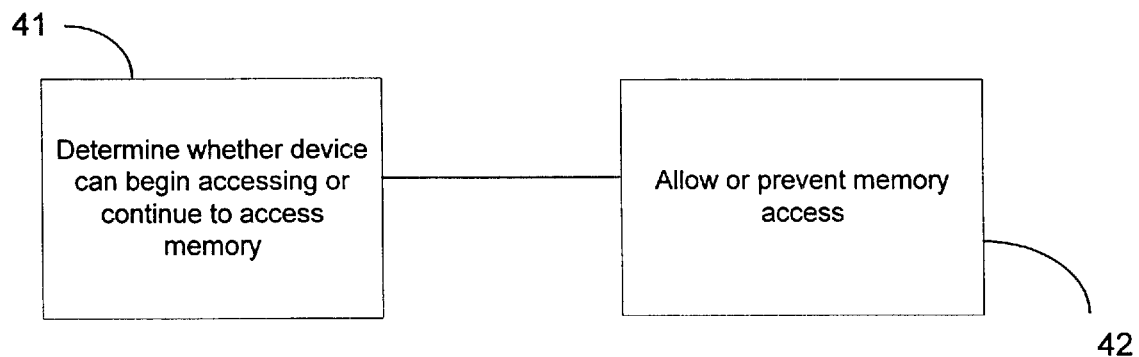
FIG. 4 is a diagram illustrating the functions performed in arbitrating access to memory.

FIG. 4 is a high level block diagram showing the basic functions carried out by the exemplary arbitration circuitry of the embodiments illustrated in FIGS. 1–3. Arbitration circuitry determines the conditions under which a device may access memory at a particular point in time (block 41), and allows or prevents memory access by the device (block 42). As already noted, the location of arbitration circuitry carrying out these functions may be varied (see text accompanying FIG. 1). Although the blocks of FIG. 4 show, at a high level, the basic functions of the exemplary arbitration circuitry of present embodiments, those functions are more precisely defined with reference to the state diagram of FIG. 5. In particular, the exemplary arbitration circuitry allows the system to transition through the various states illustrated and described in FIG. 5 and accompanying text. Examples of implementing the functions of the arbitration circuitry are shown in the timing diagrams of FIGS. 6–9.

The below descriptions of the state diagram of FIG. 5 and the timing diagrams of FIGS. 6–9 reference the embodiment of FIG. 1 in which a processor (processor 11) accesses a memory (memory 13a) also accessed by a configuration device controller (controller 13b). However, the descriptions of FIGS. 5–9 could be made equally applicable to an embodiment such as the embodiment of FIG. 2 where a PLD configured by a PLD configuration device also acts as the system processor (or even an embodiment such as the embodiment of FIG. 3, though in that case, the same clock would likely be used and the below discussions of synchronization delays would therefore be inapplicable). Instead of referring to, respectively, controller 13b, memory 13a, processor 11, bus B-1, and dedicated lines D-1a and D-1b, the below descriptions of FIGS. 5–9 could reference and be applicable to, respectively, controller 22b, memory 22a, PLD 21 (which serves as the system processor for system 20 of FIG. 2), bus line B-2, and dedicated lines D-2a and D-2b.

Figure 5:
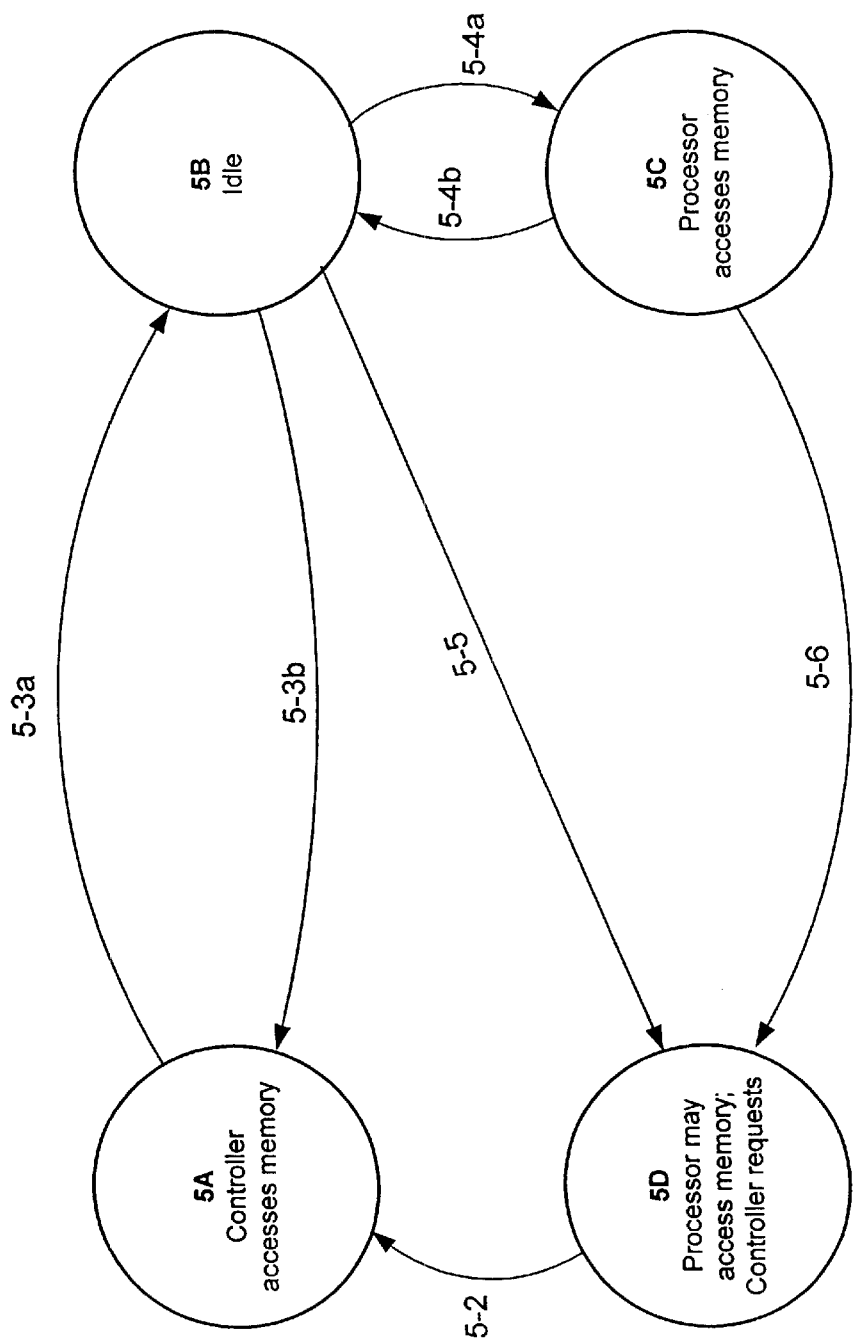
FIG. 5 is a state diagram illustrating states of system 10 of FIG. 1 under the arbitration scheme implemented by system 30's arbitration circuitry.

FIG. 5 is a state diagram indicating the various states and state-to-state transitions of system 10 of FIG. 3 as controller 13b and processor 11 utilize memory 13a. The state diagram of FIG. 5 reflects the possible states given the exemplary arbitration scheme that mediates access to memory 13a between controller 13b and processor 11.

FIG. 5 illustrates the following states: controller-access state 5A, idle state 5B, processor-access state 5C, and processor-may-access/controller-request state 5D. In controller-access state 5A, controller 13b accesses memory 13a and asserts a MEMORYBUSY signal by setting an arbitration signal sent from controller 13b to processor 11 over line D-1a equal to "1". In state 5A, processor 11 is not accessing memory 13a. A MEMORYLOCK signal from the processor is de-asserted in state 5A as processor 11 maintains the arbitration signal sent from processor 11 to controller 13b over line D-1b at a value of "0."

In FIGS. 6–9 and accompanying descriptions, MEMORYBUSY and MEMORYLOCK are discussed in more detail and related signal representations are given reference numbers. In the present embodiment, these signals are "active high" meaning that MEMORYBUSY and MEMORYLOCK are each said to be "asserted" when the respective appropriate signal value is set at "1" and are each said to be "de-asserted" when the respective appropriate signal value is set at "0". However, in alternative embodiments, MEMORYBUSY and/or MEMORYLOCK might also be communicated through signals that are active low, meaning that MEMORYBUSY and/or MEMORYLOCK would be said to be asserted when the respective appropriate signal value is set at "0" and de-asserted when the respective appropriate signal value is set at "1". The terms "MEMORYLOCK" and "MEMORYBUSY" should be understood as used herein simply as labels to facilitate description of the signaling used to arbitrate access to memory 13a between controller 13b and processor 11.

From state 5A, the system may make transition 5-3a to idle state 5B. In idle state 5B, neither controller 13b nor processor 11 are accessing memory 13a. Transition 5-3a occurs when controller 13b stops accessing memory 13a and de-asserts MEMORYBUSY by setting the arbitration signal sent from controller 13b to processor 11 over line D-1a equal to "0." In idle state 5B, neither controller 13b nor processor 11 are accessing memory 13a and neither MEMORYBUSY nor MEMORYLOCK are being asserted.

From state 5B, system 10 may make transition 5-3b to controller-access state 5A, already described; transition 5-4a to processor-access state 5C; or transition 5-5 to processor-may-access/controller-requests state 5D.

If transition 5-4a occurs, the system moves to state 5C. In state 5C, processor 11 accesses memory 13a and asserts MEMORYLOCK by setting the arbitration signal sent from processor 11 to controller 13b over line D-1b equal to "1". In state 5C, controller 13b does not access memory 13a and continues to de-assert MEMORYBUSY by maintaining the arbitration signal sent from controller 13b to processor 11 over line D-3a at"0".

If transition 5-5 occurs, the system moves from state 5B to state 5D. In state 5D, processor 11 may access, but not necessarily does access, memory 13a even though controller 13b has initiated a request to access memory 13a. In state 5D, controller 13b has asserted MEMORYBUSY but is not accessing memory 13a. Processor 11 is either accessing memory 13a and asserting MEMORYLOCK, or processor 11 is not accessing memory 13a and is not asserting MEMORYLOCK. If processor 11 is not accessing memory 13a and is not asserting MEMORYLOCK, processor 11 still may access memory 13a and assert MEMORYLOCK if the system is in state 5D.

Figure 7:
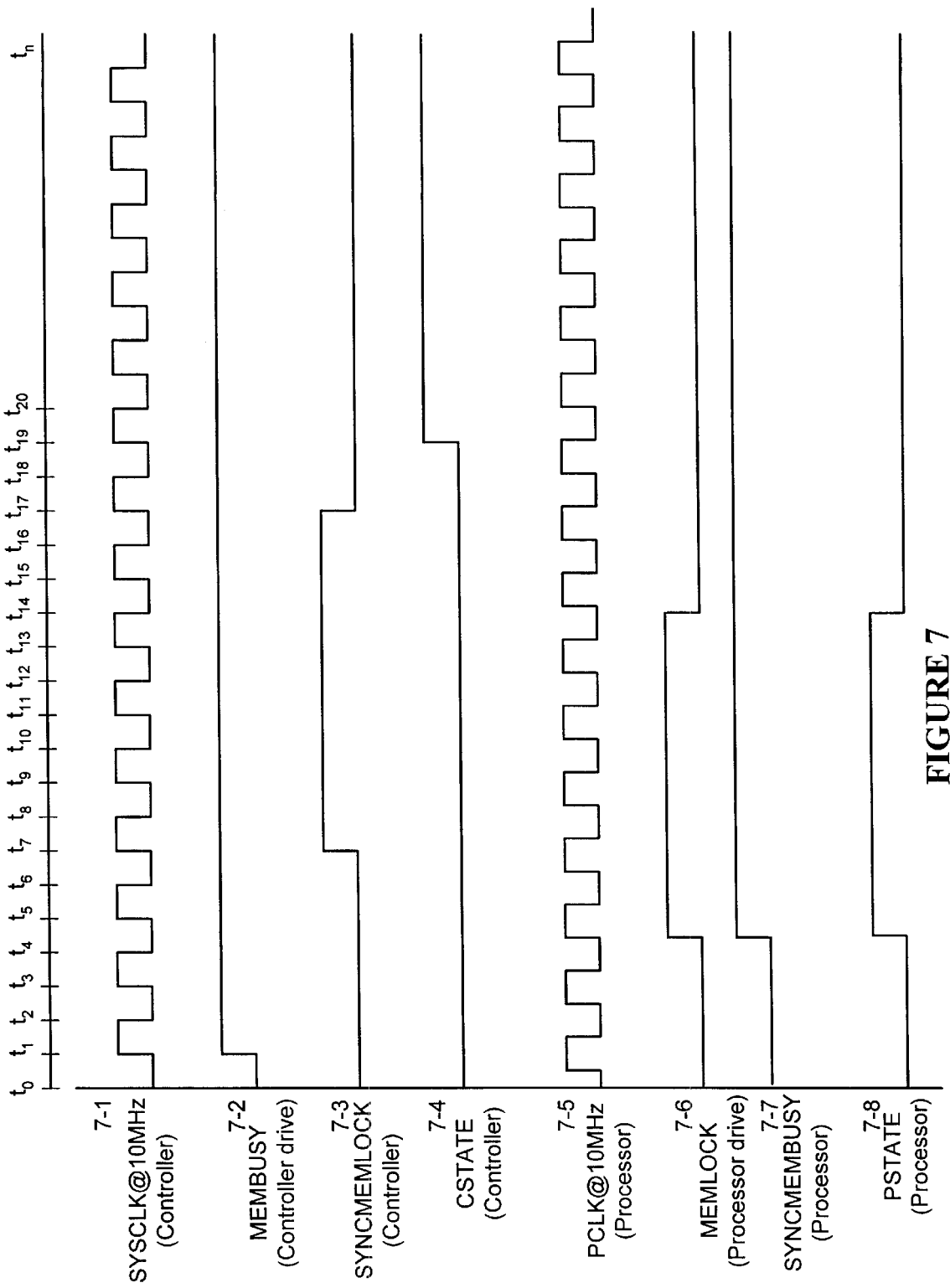
FIG. 7 is a detailed timing diagram illustrating synchronization delays when the system processor and configuration controller of FIG. 1 utilize separate clocks running at the same frequency.
Figure 8:
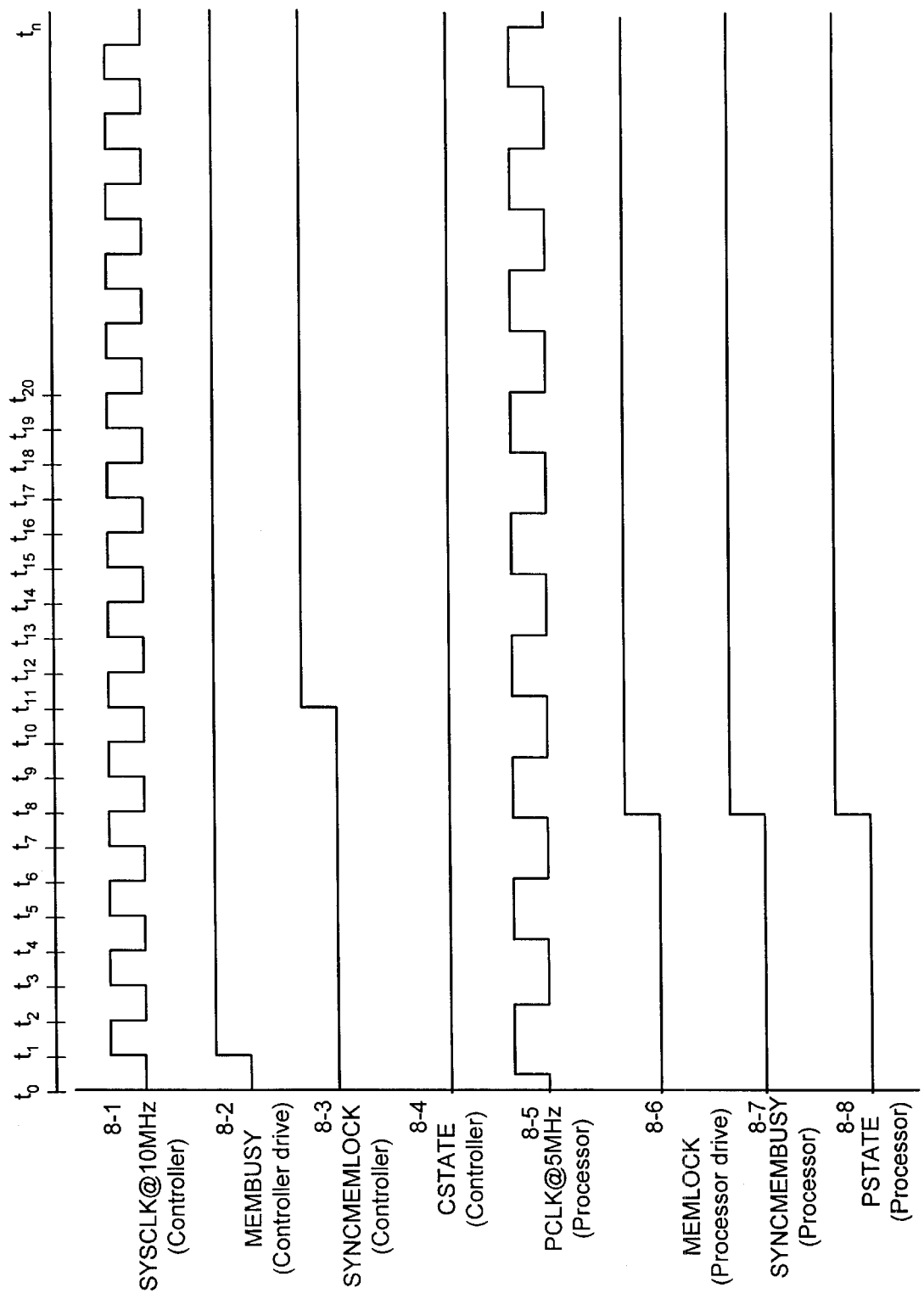
FIG. 8 is a detailed timing diagram illustrating synchronization delays when the system processor and configuration controller of FIG. 1 utilize separate clocks and the processor clock is running at half the frequency of the controller clock.
Figure 9:
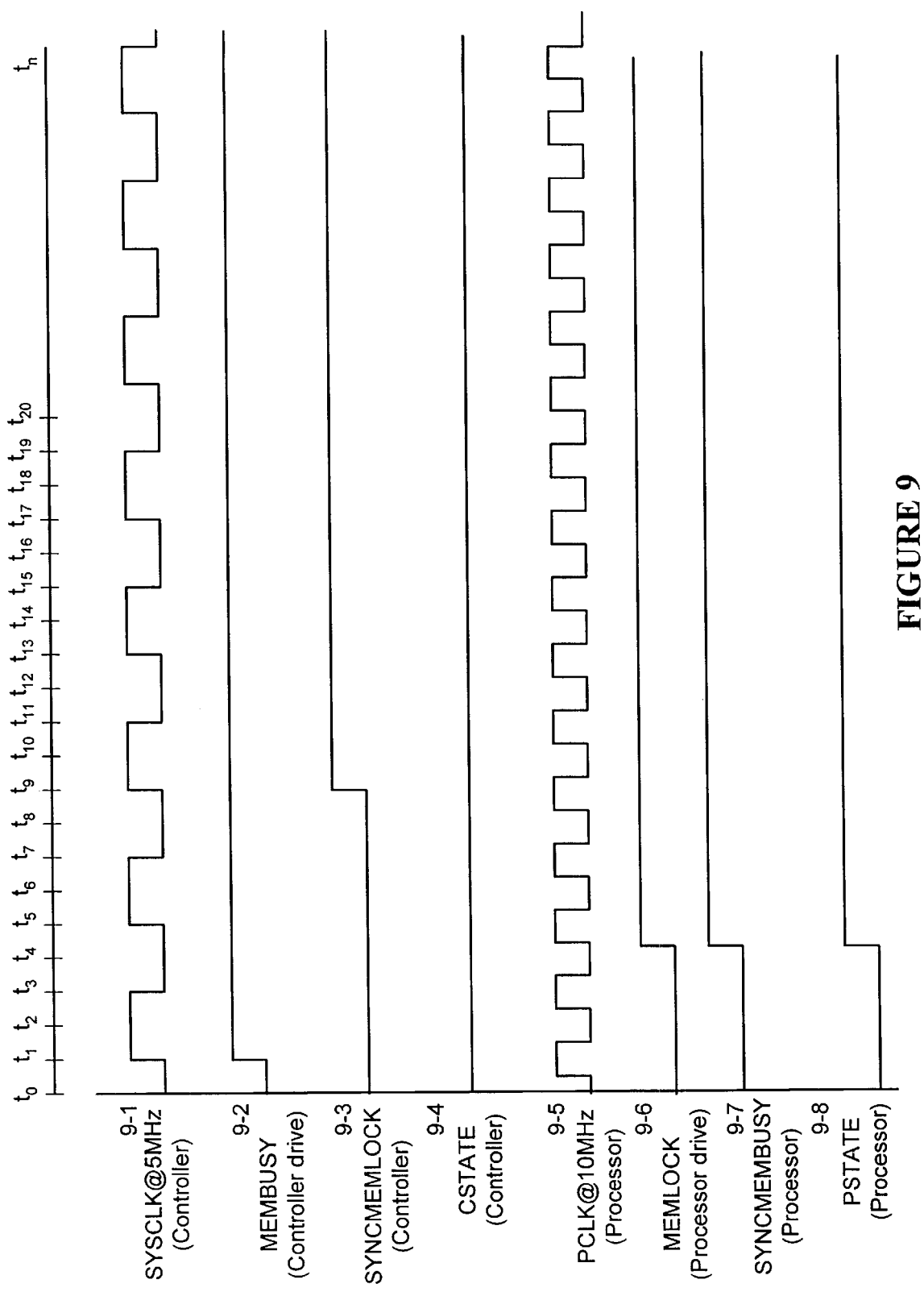
FIG. 9 is a detailed timing diagram illustrating synchronization delays when the system processor and configuration controller of FIG. 1 utilize separate clocks and the controller clock is running at half the frequency of the processor clock.

Due to synchronization delays if processor 11 and controller 13b are utilizing different clocks, as described by FIGS. 7–9 and accompanying text, there may be a delay between the time that controller 13b initiates a signal indicating MEMORYBUSY and the time that processor 11 recognizes that controller 13b has asserted MEMORYBUSY. In the present exemplary arbitration scheme, until processor 11 recognizes that controller 13b has asserted MEMORYBUSY, processor 11 may access memory 13a and assert MEMORYLOCK. This possible situation under the present arbitration scheme is reflected by the fact that state 5D includes the condition that processor 11 "may" access memory 13a (i.e., processor 11 is either actually accessing memory 13b or it is not accessing memory 13b but may do so).

From processor-access state 5C transition 5-4b or transition 5-6 may occur. Transition 5-4b returns the system to idle state 5B described above. Transition 5-6 transitions the system to state 5D, also described above.

The system designer may choose one of the possible states as the default state at power-on/reset (POR). In the present embodiment, idle state 5B is the default state at POR. However, in other embodiments, other states may be chosen.

Under the above described states reflected under the disclosed arbitration scheme, although controller 13b may request access by asserting MEMORYBUSY while processor 11 is accessing memory 13a, processor 11 does not request access to memory 11 while controller 13b is accessing memory. In alternative embodiments, an arbitration scheme might be used that allows a processor sharing access to memory with a controller to make a request to access memory while the controller is accessing memory. However, the present arbitration scheme has the advantage of allowing controller 13b to finish any configuration tasks requiring access to memory 13a without interruption from processor 11. Nevertheless, those skilled in the art will recognize that in alternative embodiments, arbitration circuitry may implement variations on the disclosed arbitration scheme without necessarily departing from the spirit and scope of the present invention.

Figure 6:
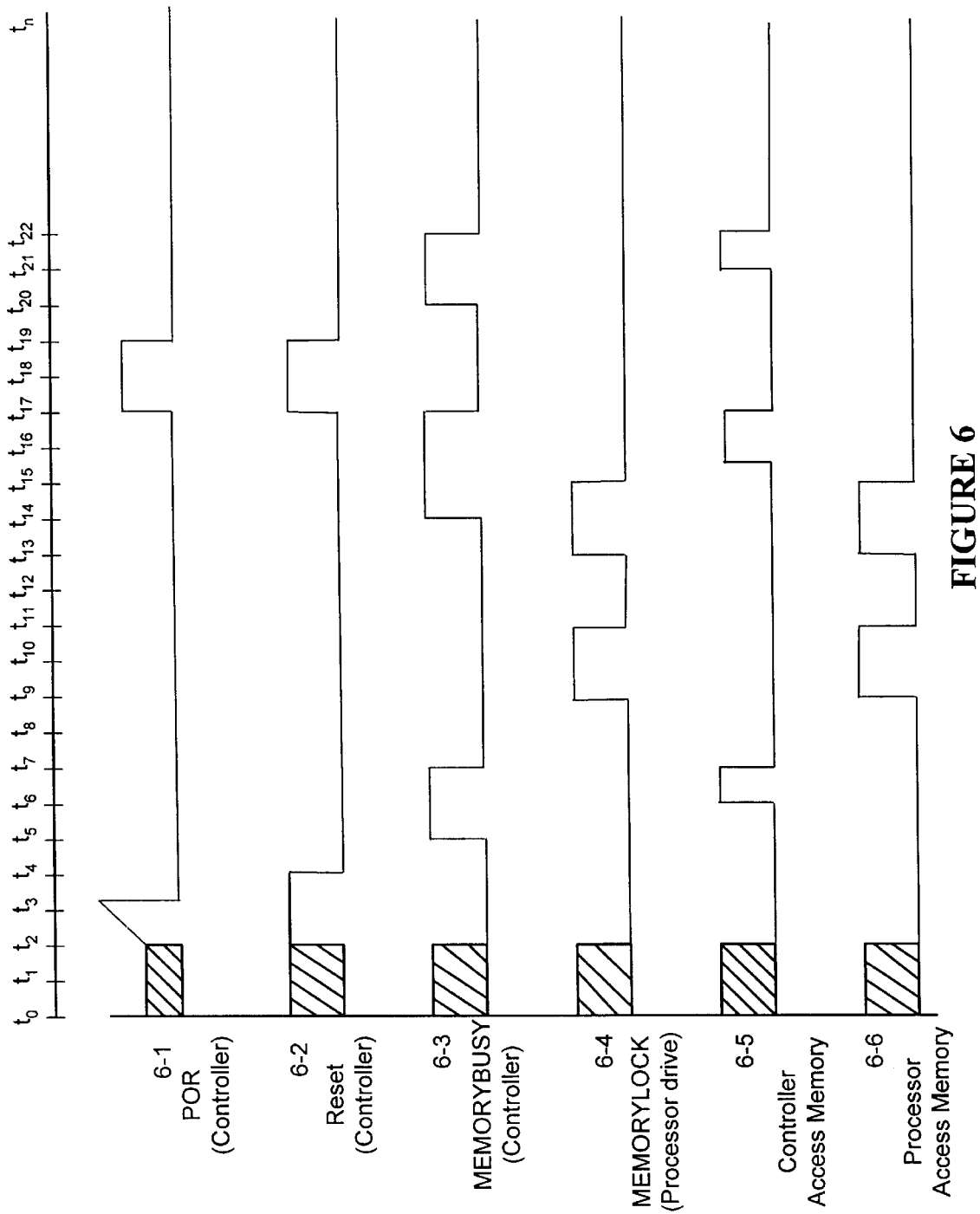
FIG. 6 is a simplified timing diagram illustrating arbitration signaling and memory access by the configuration controller and system processor of FIG. 1.

FIG. 6 is a simplified timing diagram illustrating arbitration signaling and memory access by the configuration controller and system processor of FIG. 3. FIG. 6 does not detail the synchronization delays illustrated and described in FIG. 7–9 and accompanying text.

FIG. 6 illustrates power-on reset (POR) signal 6-1, reset signal 6-2, MEMORYBUSY signal 6-3, MEMORYLOCK signal 6-4, controller access state indication 6-5, and processor access state indication 6-6. State indications 6-5 and 6-6 (like CSTATE state indications 7-4, 8-4, and 9-4 and PSTATE indications 7-8, 8-8, 9-8 in FIGS. 7–9) are not actual signals used in the present embodiment. Rather, they are simply used here for illustrative purposes to show when controller 13b or processor 11 is accessing memory 13a. In the diagram, when controller state indication 6-5 is "high" (i.e. "1"), controller 13b is accessing memory 13a and when 6-5 is "low" (i.e. "0"), controller 13b is not accessing memory 13a. When processor state indication 6-6 is high, processor 11 is accessing memory 13a, and when 6-6 is low, processor 11 is not accessing memory 13a.

Between time t0 and t2, power is off and the state of each signal is unknown. At time t2, the power-on/reset signal 6-1 spikes and controller reset signal 6-2 is high between t2 and t4. The amount of time after POR 6-1 trips that controller reset 6-2 remains high will depend on particular system requirements and may vary from one system implementation to another. As the default state at power-up or reset in the present embodiment is idle state 5B (with reference to the state diagram of FIG. 5), initially MEMORYBUSY signal 6-3, MEMORYLOCK signal 6-4, controller state indicator 6-5, and processor indicator 6-6 will all be de-asserted. At time t5, controller 13b seeks access to memory 13a and asserts MEMORYBUSY. Because MEMORYLOCK is not asserted (i.e. MEMORYLOCK signal 6-4 is low at t5) controller 13b may access memory 13a. MEMORYBUSY signal 6-3 transitions from low to high at time t5 and controller state indication 6-5 transitions from low to high at time t6. At time t7, controller 13b completes accessing memory 13a and de-asserts MEMORYBUSY, thus, as illustrated, both controller state indication 6-5 and MEMORYBUSY signal 6-3 transition from high to low at time t7.

At time t9, processor 11 accesses memory 13a and asserts MEMORYLOCK; thus, as illustrated, both processor state indication 6-6 and MEMORYLOCK signal 6-4 transition from low to high at time t9. At time t11, processor 11 completes accessing memory 13a and de-asserts MEMORYLOCK, thus, as illustrated, both processor state indication 6-6 and MEMORYLOCK signal 6-4 transition from high to low at time t11. At time t13, processor 11 again accesses memory 11 and asserts MEMORYLOCK; thus, as illustrated, both processor state indication 6-6 and MEMORYLOCK signal 6-4 transition from low to high at time t13. At time t14, controller 13b seeks to access memory 13a and asserts MEMORYBUSY, thus MEMORYBUSY signal 6-3 transitions from low to high at time t14. Because MEMORYLOCK is still being asserted at time t14, controller 13b does not access memory 13a at time t14 and thus, as illustrated, although MEMORYBUSY signal 6-3 goes high at time t14, controller access indication 6-5 remains low. In the present embodiment, when processor 11 recognizes that MEMORYBUSY has been asserted by controller 13b, processor 11 will complete accessing memory 13a as soon as possible.

The meaning of "as soon as possible" will vary depending on other various system requirements. Although in the present embodiment, processor 11 completes access of memory 13a as soon as possible, it is possible for a particular system to allow the processor to complete all of its present tasks before completing access to the memory without departing from the spirit of the present invention.

At time t15, processor 11 completes accessing memory 13a and de-asserts MEMORYLOCK; thus processor access indication 6-6 and MEMORYLOCK signal 6-3 transition from high to low at time t15. Between time t15 and t16, controller 13b accesses memory 13a while continuing to assert MEMORYBUSY; thus, as illustrated, controller access indication 6-5 transitions from low to high between times t14 and t15 while MEMORYBUSY signal 6-3 remains high.

At time t17, POR trips and controller reset signal 6-2 goes high from time t17 to time t19. Once the controller reset signal goes high at time t17, the system returns to idle, and MEMORYBUSY signal 6-3, MEMORYLOCK signal 6-4, controller access indication 6-5, and processor access indication 6-6 are low while reset signal 6-2 is high. At time t19, reset signal 6-2 goes low. At time t20, controller 13a asserts MEMORYBUSY and accesses memory 13a; thus, as illustrated, MEMORYBUSY signal 6-3 transitions to high at time t20 and controller access indication 6-5 transitions to high at time t21. At time t22, controller 13b completes accessing memory 13a and de-asserts MEMORYBUSY thus, as illustrated, MEMORYBUSY signal 6-3 and controller access indication 6-5 transition from high to low at time t22.

FIG. 7 is a detailed timing diagram illustrating synchronization delays when the system processor and configuration controller of FIG. 3 utilize separate clocks running at the same frequency. SYSCLK signal 7-1 shows an exemplary 10 megahertz (MHz) clock signal that might be utilized by controller 13b. CSTATE indication 7-4 reflects whether or not controller 13b is actually accessing memory 13a by sending and/or receiving data to and/or from memory 13a. PCLK signal 7-5 shows an exemplary 10 MHz clock signal that might be utilized by processor 11. PSTATE indication 7-8 reflects whether or not processor 11 is accessing memory 13a by sending and/or receiving data to and/or from memory 13a.

The state of the MEMORYBUSY signal sent from controller 13b to processor 11 (discussed above, see FIG. 6 and accompanying text) may, at a given point in time, be different at controller 13b and at processer 11 due to synchronization delays. Thus, FIG. 7 shows two signals relevant to the MEMORYBUSY signal discussed in relation to FIG. 6. MEMBUSY signal 7-2 reflects the state of the MEMORYBUSY signal transmitted on line D-1a as read by controller 13b using controller 13b's clock signal SYSCLK signal 7-1. SYNCMEMBUSY (processor) signal 7-7 is the MEMORYBUSY signal as read by processor 11 using processor 11's clock signal PCLK signal 7-5. Similarly, FIG. 7 shows two signals relevant to the MEMORYLOCK signal, also discussed in relation to FIG. 6. MEMLOCK signal 7-6 reflects the state of the MEMORYLOCK signal transmitted on line D-1b as read by processor 11 using processor 11's clock signal PCLK signal 7-5. SYNCMEMLOCK (controller) signal 7-3 reflects the state of the MEMORYLOCK signal as read by controller 13b using controller 13b's clock signal SYSCLK signal 7-1.

FIG. 7 illustrates a "worst case" scenario in order to illustrate the specified period of time that controller 13b must wait after asserting MEMORYBUSY before actually accessing memory 13a. In other words, FIG. 7 illustrates a scenario under which, due to synchronization delays, processor 11 receives a MEMORYBUSY signal asserted by controller 13b just after processor 11 begins accessing memory 13a and before controller 13b receives a MEMORYLOCK signal asserted by processor 11.

During the time period from time t0 to t4, processor 11 is not accessing memory 13a. At time period t1, controller 13b seeks to access memory 13a and therefore asserts MEMORYBUSY by setting MEMBUSY signal 7-2 equal to 1. The present example assumes a 2 clock cycle synchronization delay, which is defined as meaning that, with reference to the receiving device's clock signal, a change in signal value is not reflected at the receiving device until during the 2nd clock cycle after the signal changes at the originating device. In the case of devices that have double-flopped inputs (i.e., the inputs have two flip flops connected in series), a 2 cycle delay would mean that the relevant signal change would not be reflected at the receiving device until the second rising edge of the receiver's clock signal after the signal change was reflected at the originating device. Thus, as illustrated, at time t1, t2, t3, and t4, processor 11 does not know that MEMORYBUSY has been asserted because SYNCMEMBUSY processor) signal 7-7 still reads 0. Between time t4 and t5, processor 11 asserts MEMORYLOCK by setting MEMLOCK signal 7-6 equal to 1 and accesses memory 13a just as SYNCMEMBUSY (processor) signal 7-7 shifts from 0 to 1. Processor 11 has asserted MEMORYLOCK by setting MEMLOCK signal 7-6 equal to 1 between time t4 and t5. Assuming a 2 clock cycle (referring to the clock used by the controller shown by SYSCLK signal 7-1) synchronization delay, SYNCMEMLOCK (controller) signal 7-3 will not shift from 0 to 1 until time t7. Time t7 is the beginning of the fourth clock cycle of the controller's clock signal SYSCLK signal 7-1 after MEMBUSY signal 7-2 shifted from 0 to 1. Thus, controller 13b should wait 4 clock cycles after asserting MEMBUSY before assuming that its sampling of the SYNCMEMLOCK signal gives a valid indication that processor 11 is not accessing memory 13a.

In this case, at the beginning of the fourth clock cycle, SYNCMEMLOCK signal 7-3 transitions from 0 to 1 indicating that memory 13a is not available to controller 13b. Thus, controller 13a waits to access memory 13a, but continues to assert MEMORYBUSY by maintaining MEMBUSY signal 7-2 at a high value. Between t14 and t15, processor 11 stops accessing memory 13a and de-asserts MEMORYLOCK by setting MEMLOCK signal 7-6 equal to 0. At t 17, SYNCMEMLOCK signal 7-3 at the controller transitions from 1 to 0 indicating to the controller that it may now access memory 13a. In this example, controller 13b begins to access memory 13a at t19, the beginning of its next clock cycle.

FIG. 8 is a detailed timing diagram illustrating synchronization delays when the system processor and configuration controller of FIG. 3 utilize separate clocks running at different frequencies, the clock utilized by the processor having half the frequency of the clock utilized by the controller. SYSCLK signal 8-1 shows an exemplary 10 MHz clock signal that might be utilized by controller 13b. CSTATE indication 8-4 reflects whether or not controller 13b is actually accessing memory 13a by sending and/or receiving data to and/or from memory 13a. PCLK signal 8-5 shows an exemplary 5 MHz clock signal that might be utilized by processor 11. PSTATE indication 8-8 reflects whether or not processor 11 is actually accessing memory 13a by sending and/or receiving data to and/or from memory 13a.

Like FIG. 7, FIG. 8 shows two signals relevant to the MEMORYBUSY signal discussed in relation to FIG. 4. MEMBUSY signal 8-2 reflects the state of the MEMORYBUSY signal transmitted on line D-1a as read by controller 13b using controller 13b's clock signal SYSCLK signal 8-1. SYNCMEMBUSY (processor) signal 8-7 is the MEMORYBUSY signal as read by processor 11 using processor 11's clock signal PCLK signal 8-5 . Similarly, FIG. 8 shows two signals relevant to the MEMORYLOCK signal, also discussed in relation to FIG. 4. MEMLOCK signal 8-6 reflects the state of the MEMORYLOCK signal transmitted on line D-1b as read by processer 11 using processor 11's clock signal PCLK signal 8-5. SYNCMEMLOCK (controller) signal 8-3 reflects the state of the MEMORYLOCK signal as read by controller 13b using controller 13b's clock signal SYSCLK signal 8-1.

Also like FIG. 7, FIG. 8 illustrates a "worst case" scenario (see text accompanying FIG. 7 describing "worst case scenario") in order to illustrate the period of time that controller 13b should wait after asserting MEMORYBUSY before actually accessing memory 13a. During the time period from time t0 to t7, processor 11 is not accessing memory 13a. At time period t1, controller 13b seeks to access memory 13aand therefore asserts MEMORYBUSY by setting MEMBUSY signal 8-2 equal to 1. However, assuming a 2 clock cycle synchronization delay (referring to the clock signal used by the receiving device, PCLK signal 8-5), at times t1-t7, processor 11 does not know that MEMORYBUSY has been asserted because SYNCMEMBUSY (processor) signal 8-7 still reads 0. Note that with respect to controller clock signal SYSCLK 8-1, the same synchronization delay is 4 clock cycles. At time t8, processor 11 asserts MEMORYLOCK by setting MEMLOCK signal 8-6 equal to 1 and accesses memory 13a just as SYNCMEMBUSY (processor) signal 8-7 shifts from 0 to 1. Assuming a 2 clock cycle synchronization delay (referring to the clock used by the controller shown by SYSCLK signal 8-1), SYNCMEMLOCK (controller) signal 8-3 will not shift from 0 to 1 until time t11. Time t11 is the beginning of the 6th clock cycle of SYSCLK signal 8-1 after MEMBUSY signal 8-2 shifted from 0 to 1. Thus, controller 13b should wait 6 clock cycles of SYSCLK signal 8-1 after asserting MEMORYBUSY before assuming that its sampling of the SYNCMEMLOCK signal 8-3 gives a valid indication that processor 11 is not accessing memory 13a.

In this case, at the beginning of the 6th clock cycle of SYSCLK signal 8-1, SYNCMEMLOCK signal 8-3 transitions from 0 to 1 indicating that memory 13a is not available to controller 13b. Thus, controller 13b waits to access memory 13a, but continues to assert MEMORYBUSY by maintaining MEMBUSY signal 8-2 at a high value.

FIG. 9 is a detailed timing diagram illustrating synchronization delays when the system processor and configuration controller of FIG. 3 utilize separate clocks running at different frequencies, the clock utilized by controller 13b having half the frequency of the clock utilized by processor 11. SYSCLK signal 9-1 shows an exemplary 5 MHz clock signal that might be utilized by controller 13b. CSTATE indication 9-4 reflects whether or not controller 13b is actually accessing memory 13a by sending and/or receiving data to and/or from memory 13a. PCLK signal 9-5 shows an exemplary 10 MHz clock signal that might be utilized by processor 11. PSTATE indication 9-8 reflects whether or not processor 11 is actually accessing memory 13a by sending and/or receiving data to and/or from memory 13a.

Like FIG. 7 and FIG. 8, FIG. 9 shows two signals relevant to the MEMORYBUSY signal discussed in relation to FIG. 5. MEMBUSY signal 9-2 reflects the state of the MEMORYBUSY signal transmitted on line D-1 a as read by controller 13b using controller 13b's clock signal SYSCLK signal 9-1. SYNCMEMBUSY (processor) signal 9-7 is the MEMORYBUSY signal as read by processer 11 using processor 11's clock signal PCLK signal 9-5. Similarly, FIG. 9 shows two signals relevant to the MEMORYLOCK signal, also discussed in relation to FIG. 4. MEMLOCK signal 9-6 reflects the state of the MEMORYLOCK signal transmitted on line D-1b as read by processer 11 using processor 11's clock signal PCLK signal 9-5. SYNCMEMLOCK (controller) signal 9-3 reflects the state of the MEMORYLOCK signal as read by controller 13b using controller 13b's clock signal SYSCLK signal 9-1.

Also like FIG. 7 and FIG. 8, FIG. 9 illustrates a "worst case" scenario in order to illustrate the specified period of time that controller 13b should wait after asserting MEMORYBUSY before actually accessing memory 13a. During the time period from time t0 to t4, processor 11 is not accessing memory 13a. At time period t1, controller 13b seeks to access memory 13a and therefore asserts MEMORYBUSY by setting MEMBUSY signal 9-2 equal to 1. However, assuming a 2 clock cycle synchronization delay (referring to the clock signal used by the receiving device, PCLK signal 9-5), at times t1-t4, processor 11 does not know that MEMORYBUSY has been asserted because SYNCMEMBUSY (processor) signal 9-7 still reads 0. Note that with respect to controller clock signal SYSCLK 9-1, the same synchronization delay is only 1 clock cycle. Between time t4 and t5, processor 11 asserts MEMORYLOCK by setting MEMLOCK signal 9-6 equal to 1 and accesses memory 13a just as SYNCMEMBUSY (processor) signal 9-7 shifts from 0 to 1. Assuming a 2 clock cycle synchronization delay (referring to the clock used by the controller shown by SYSCLK signal 9-1), SYNCMEMLOCK (controller) signal 8-3 will not shift from 0 to 1 until time t9. Time t9 is the beginning of the 3rd clock cycle of SYSCLK signal 9-1 after MEMBUSY signal 9-2 shifted from 0 to 1. Thus, controller 13b should wait 3 clock cycles of SYSCLK signal 9-1 after asserting MEMORYBUSY before assuming that its sampling of the SYNCMEMLOCK signal 9-3 gives a valid indication that processor 11 is not accessing memory 13a.

In this case, at the beginning of the third clock cycle of SYSCLK signal 9-1, SYNCMEMLOCK signal 9-3 transitions from 0 to 1 indicating that memory 13a is not available to controller 13b. Thus, controller 13b waits to access memory 13a, but continues to assert MEMORYBUSY by continuing to send a high MEMBUSY signal 9-2 to processor 11.

Although particular embodiments have been described in detail, various modifications to the embodiments described herein may be made without departing from the spirit and scope of the present invention. To cite but one example in addition to those possible variations already discussed, when the present invention is implemented to provide access to a configuration memory by both a configuration controller and a PLD configured by the configuration controller (e.g., see system 20 of FIG. 2), certain of the signals that might used in such a system for other purposes may potentially also be utilized to serve certain of the arbitration signal functions relevant to the arbitration scheme disclosed herein. For example, in embodiments such as system 20 of FIG. 2, when a configuration controller such as controller 22b enters a mode for configuring a PLD such as PLD 21, a configuration signal may be used to indicate entry into a configuration mode. In such a mode, a PLD would generally be required to cease any memory access operations so that it may be configured. Thus, the configuration mode signal would serve the function of freeing access to the memory so it may be accessed by the configuration element to perform the necessary memory read operations to configure the PLD.

Because various modifications to the disclosed embodiments can be made without departing from the spirit and scope of the invention, the invention is limited only by the appended claims.

We claim:

1. A programmable logic configuration device comprising:
   a controller operatively coupled to pins connectable to a programmable logic device, the controller being for configuring the programmable logic device using configuration data;
   a memory for storing configuration data;
   a bus operatively coupled to the memory, to the controller, and to pins connectable to a processor; and
   arbitration circuitry operatively coupled to the controller and to pins connectable to the processor, the arbitration circuitry being for arbitrating access to the memory between the controller and the processor.

2. The programmable logic configuration device of claim 1 wherein the arbitration circuitry is for at least:
   asserting a first signal indicating that the controller either seeks to access the memory or is accessing the memory;
   detecting assertion of a second signal indicating that the processor is accessing the memory; and allowing the controller to access the memory if the first signal has been asserted and if assertion of the second signal is not detected.

3. An electronic system comprising the programmable logic configuration device of claim 2.

4. The electronic system of claim 3 further comprising:

a first clock utilized by the processor; and a second clock utilized by the controller;

wherein the arbitration circuitry is also for at least allowing the controller to access the memory if the first signal has been asserted and if assertion of the second signal has not been detected for a period of time after assertion of the first signal, the period of time accounting for effects of synchronization delays.

5. The electronic system of claim 3 wherein the processor is programmed to detect assertion of the first signal and, if the processor is accessing the memory when assertion of the first signal is detected, to finish accessing the memory as soon as possible after detection of the first signal.

6. An electronic system comprising the programmable logic configuration device of claim 1.

7. A programmable logic configuration device comprising:

a controller operatively coupled to pins connectable to a programmable logic device, the controller being for configuring the programmable logic device using configuration data;

a memory for storing configuration data;

a bus operatively coupled to the memory, to the controller, and to pins connectable to the programmable logic device; and arbitration circuitry operatively coupled to the controller and to pins connectable to the programmable logic device, the arbitration circuitry being for arbitrating access to the memory between the controller and the programmable logic device.

8. The programmable logic configuration device of claim 7 wherein the arbitration circuitry is also for at least:

asserting a first signal indicating that the controller either seeks to access the memory or is accessing the memory;

detecting assertion of a second signal indicating that the programmable logic device is accessing the memory; and allowing the controller to access the memory if the first signal has been asserted and if assertion of the second signal is not detected.

9. An electronic system comprising the programmable logic configuration device of claim 8.

10. The electronic system of claim 9 further comprising:

a first clock utilized by the programmable logic device; and a second clock utilized by the controller;

wherein the arbitration circuitry is also for at least allowing the controller to access the memory if the first signal has been asserted and if assertion of the second signal has not been detected for a period of time after assertion of the first signal; the period of time accounting for effects of synchronization delays.

11. The electronic system of claim 9 wherein the programmable logic device is programmed to detect assertion of the first signal and, if the programmable logic device is accessing the memory when assertion of the first signal is detected, to finish accessing the memory as soon as possible after detection of the first signal.

12. An electronic system comprising the programmable logic configuration device of claim 7.

13. In an electronic system comprising a first device, the first device being a programmable logic configuration device, the programmable logic configuration device comprising a controller and a memory, a method of memory utilization comprising:

providing access to the memory by the controller and by a second device of the electronic system; and providing arbitration circuitry operatively coupled to the controller and the second device, the arbitration circuitry being for arbitrating access to the memory between the controller and the second device.

14. The method of claim 13 wherein the arbitration circuitry is also for at least:

asserting a first signal indicating that the controller either seeks to access the memory or is accessing the memory;

asserting a second signal indicating that the second device is accessing the memory;

detecting assertion of the first signal and of the second signal;

allowing the controller to access the memory if the first signal is asserted and if assertion of the second signal is not detected; and allowing the second device to access the memory if the second signal is asserted and if assertion of the first signal is not detected.

15. The method of claim 14 further comprising:

programming the second device to finish accessing the memory as soon as possible if the first signal is detected while the second device is accessing the memory.

16. The method of claim 15 wherein the second device is a programmable logic device configured by the programmable logic configuration device.

17. The method of claim 14 wherein the second device is a programmable logic device configured by the programmable logic configuration device.

18. The method of claim 13 wherein the second device utilizes a first clock and the controller utilizes a second clock and wherein the arbitration circuitry is also for:

asserting a first signal indicating that the controller seeks to access the memory or is accessing the memory;

detecting assertion of a second signal indicating that the second device is accessing the memory; and allowing the controller to access the memory if the first signal has been asserted and if assertion of the second signal is not detected after a period of time that accounts for effects of synchronization delays.

19. The method of claim 18 further comprising:

programming the second device to finish accessing the memory as soon as possible after assertion of the first signal is detected if the second device is accessing the memory when assertion of the first signal is detected.

20. The method of claim 19 wherein the second device is a programmable logic device configured by the programmable logic configuration device.

21. The method of claim 18 wherein the second device is a programmable logic device configured by the programmable logic configuration device.

22. The method of claim 13 wherein the second device is a programmable logic device configured by the programmable logic configuration device.

23. A programmable logic device comprising:

a programmable logic configuration device for configuring the programmable logic device, the programmable logic configuration device comprising:

a controller;

a memory;

a bus operatively coupled to the memory, to the controller, and to pins connectable to a processor; and arbitration circuitry operatively coupled to the controller and to pins connectable to the processor, the arbitration circuitry being for arbitrating access to the memory between the controller and the processor.

24. An electronic system comprising the programmable logic device of claim 23.

25. A programmable logic device having a first block for executing at least one function of the programmable logic device, the programmable logic device further comprising:

a configuration controller for configuring the programmable logic device using configuration data;

a configuration memory for storing configuration data;

a bus operatively coupled to the memory, to the controller, and to the first block; and arbitration circuitry operatively coupled to the controller and to the first block, the arbitration circuitry being for arbitrating access to the configuration memory between the controller and the first block.

26. An electronic system comprising the programmable logic device of claim 25.

27. A programmable logic configuration device, the programmable logic configuration device being a first device, the programmable logic configuration device comprising:

a controller operatively coupled to pins connectable to a programmable logic device, the controller being for configuring the programmable logic device using configuration data;

a memory for storing configuration data;

a bus operatively coupled to the memory, to the controller, and to pins connectable to a plurality of second devices; and arbitration circuitry operatively coupled to the controller and to pins connectable to the plurality of second devices, the arbitration circuitry being for arbitrating access to the memory between the controller and the plurality of second devices.

28. A programmable logic configuration device comprising:

a controller operatively coupled to pins connectable to a programmable logic device, the controller being for configuring a programmable logic device using configuration data;

a memory for storing configuration data;

means for providing access to the memory by the controller and by a second device; and means for arbitrating access ;to the memory between the controller and the second device.

29. The programmable logic configuration device of claim 28 wherein the second device is the programmable logic device configured by the controller.

30. A programmable logic device comprising:

a programmable logic configuration device for configuring the programmable logic device, the programmable logic configuration device comprising:

controller means for configuring the programmable logic device using configuration data;

memory means for storing configuration data;

means for providing access to the memory means by the controller means and a first block of the programmable logic device; and means for arbitrating access to the memory means between the controller means and the first block of the programmable logic device.

* * * * *